United States Patent [19]

Noro

[11] Patent Number: 4,530,026
[45] Date of Patent: Jul. 16, 1985

[54] OUTPUT TRANSISTOR PROTECTION CIRCUIT IN A POWER AMPLIFIER WITH COLLECTOR POWER DISSIPATION LIMITATION

[75] Inventor: Masao Noro, Hamamatsu, Japan

[73] Assignee: Nippon Gakki Seizo Kabushiki Kaisha, Hamamatsu, Japan

[21] Appl. No.: 483,565

[22] Filed: Apr. 11, 1983

[30] Foreign Application Priority Data

May 11, 1982 [JP] Japan .................................. 57-79046

[51] Int. Cl.³ .......................... H02H 7/20; H03F 3/04
[52] U.S. Cl. ...................................... 361/88; 361/79; 361/86; 330/207 P; 330/298
[58] Field of Search .................. 361/88, 89, 79, 86, 361/87, 98; 330/207 P, 298

[56] References Cited

U.S. PATENT DOCUMENTS 3,681,659 8/1972 Suzuki ........................ 330/207 P X
3,946,280 3/1976 Quist .................................. 330/207 P
4,173,739 11/1979 Yoshida ............................ 361/79 X Primary Examiner—Patrick R. Salce
Attorney, Agent, or Firm—Spensley Horn Jubas & Lubitz

[57] ABSTRACT

An output transistor protection circuit in a power amplifier comprises a limiter circuit which limits a collector power dissipation of the output transistors to a predetermined magnitude in accordance with an output voltage level of the amplifier and a current level of the output transistors. For sure limitation operation with a low cost construction, and without destruction of signal waveform, limitation characteristics of the limiter circuit is varied in accordance with detection results of an output voltage level detection circuit which detects whether the output voltage level is smaller than a predetermined magnitude, and a clipping condition detection circuit which detects whether an output stage of the amplifier is clipped.

7 Claims, 8 Drawing Figures

OUTPUT TRANSISTOR PROTECTION CIRCUIT IN A POWER AMPLIFIER WITH COLLECTOR POWER DISSIPATION LIMITATION

BACKGROUND OF THE INVENTION (a) Field of the Invention

This invention relates to an output transistor protection circuit in a power amplifier, and more particularly, to a protection circuit with a function of limiting a collector power dissipation of an output transistor to a predetermined magnitude so as to protect the output transistor from the destruction thereof.

(b) Description of the Prior Art

A prior art output transistor protection circuit with collector power dissipation limitation limits an input signal magnitude of an output transistor to a predetermined magnitude based on the detection of an output voltage level of an amplifier and a current level of the output transistor, thereby the collector power dissipation of the output transistor being limited to a predetermined magnitude.

Prior art FIG. 1 shows an amplifier having such a protection circuit. The amplifier is formed in a complementary push-pull configuration comprising NPN transistors 1a, 2a and 3a in Darlington connection and PNP transistors 1b, 2b and 3b in Darlington connection. In this amplifier, the transistors 3a and 3b are adapted to operate as output transistors. Reference numerals 4a and 4b designate protection circuits for the respective NPN transistors and PNP transistors.

In the protection circuit 4a for the NPN transistors 1a, 2a and 3a, a base of the transistor 1a is connected to an output terminal 5 via a diode 10a and a NPN transistor 11a connected in series and in a forward direction, an emitter of the output transistor 3a is connected to the output terminal 5 via an emitter resistor 6a (resistance value: Re) and to a base of the transistor 11a via a resistor 7a (resistance value: R1), and the base of the transistor 11a is connected to the ground via a resistor 8a (resistance value: R2) and a diode 9a in a forward direction and in this order.

The protection circuit 4b for the PNP transistors 1b, 2b and 3b in a negative side is formed in a same manner as the protection circuit 4a, and corresponding parts are designated using same reference numerals as those of the circuit 4a with suffix of b.

In the protection circuit 4a, upon an assumption that an output voltage at the output terminal 5 is Vo, and that an output current of the amplifier or a collector current of the transistor 3a is Io, a voltage potential at the base of the transistor 11a are presented as follows:

$$V1 = (Re \cdot Io + Vo) \times \frac{R2}{R1 + R2} \quad (1)$$

wherein a forward voltage drop of the diode 9a is ignored.

Then, a protection operation of the protection circuit 4a is explained as follows. When the voltage difference between the voltage V1 and the output voltage Vo becomes greater than a base-emitter voltage $V_{BE}$ of the transistor 11a, namely when the following inequality (2) is established, the transistor 11a becomes conductive.

$$(Re \cdot Io + Vo) \times \frac{R2}{R1 + R2} - Vo \geq V_{BE} \approx 0.6 \, [V] \quad (2)$$

Accordingly, the base current of the transistor 1a which is applied with an input signal is bypassed to the output terminal 5 via the diode 10a and the transistor 11a, thereby the input signal being limited to a predetermined magnitude, with the result that the collector current of the output transistor 3a is reduced so as to limit the collector power dissipation of the output transistor 3a to a predetermined magnitude.

The protection operation of the protection circuit 4b in the negative side is performed in a same manner as that of the protection circuit 4a for the output transistor 3b.

From the inequality (2) above, a collector power dissipation limitation characteristics of the protection circuits 4a and 4b are expressed as following equation.

$$Io = \frac{R2}{Re \cdot R2} \times Vo + \frac{R1 + R2}{R1 \cdot R2} \times V_{BE} \quad (3)$$

Accordingly, the characteristics are also expressed as solid lines A and B shown in FIG. 2. In detail, as shown in FIG. 2 by the solid line A, a limitation level of the output current Io flowing through the output transistor 3a becomes $(R1/Re \cdot R2) \times V_{BE}$ when the output voltage Vo becomes null, for example, when a load connected to the output terminal 5 is short-circuited, and when the output voltage Vo increases in a positive direction from the null condition, the limitation level of the output current Io increases linearly by a gradient of $R1/(Re \cdot R2)$, and on the other hand when the output voltage Vo increases in a negative direction from the null condition, the limitation level of the output current Io is maintained in a constant level of $(R1/Re \cdot R2) \times V_{BE}$ due to a non-conductiveness of the diode 9a.

A limitation level of the output current Io flowing through the output transistor 3b is presented by the solid line B shown in FIG. 2 based on a reason similar as that with respect to the output transistor 3a. It should be noted here that reference symbols A' and B' designate areas where protections of the respective output transistors 3a and 3b are performed.

To the output terminal 5 is ordinarily connected a loudspeaker having a reactance as a load of the amplifier. Therefore, relation between the output voltage Vo and the output current Io is expressed by a short dashes line C in FIG. 2 under the influence of a reactance component of the loudspeaker. It should be noted here that impedance phase deviation of a loudspeaker appears by 35° to 40° to the extent with respect to a resonance frequency $f_0$ of the loudspeaker. Accordingly, when the protection circuit 4a and 4b are utilized in the amplifier, waveform distortion is developed in hatched areas shown in FIG. 2.

To solve the above-mentioned problem of waveform distortion, it is imagined that the resistance values R1 and R2 are adjusted at appropriate values so that the limitation levels of the output current Io under the condition of Vo=0 go out of the hatched area in FIG. 2, namely that the collector power dissipation characteristics of the protection circuits 4a and 4b are arranged as shown by solid lines A and B in FIG. 3.

However, another problem is developed under the above-mentioned solution as follows. When the load is continuously short-circuited, the current Io of enlarged limitation level under the condition of Vo=0 flows through the output transistors 3a and 3b continuously for a long period of time, with the result that the transistors 3a and 3b are destroyed due to over-currents flowing through the transistors 3a and 3b.

In this solution, it is able to solve the destruction problem by means of utilizing the output transistors with large current capacity and large radiators with large rediation capacity. However, this method has a disadvantage at the point of manufacture cost.

SUMMARY OF THE INVENTION

It is an object of this invention to provide an output transistor protection circuit in a power amplifier which achieves a protection of output transistors with no development of waveform distortion.

It is an another object of this invention to provide the protection circuit as described above which surely achieves the protection of output transistors.

It is a further object of this invention to provide the protection citcuit as described above thriftily with no enlarging the capacity of the output transistors and radiators of the transistors.

In a preferred embodiment of this invention which will described hereinunder in detail, the output transistor protection circuit in a power amplifier comprises: limiter means for limitting an input signal of the amplifier in accordance with an output voltage level of the amplifier and a current level of the output transistor, thereby a collector power dissipation of the output transistor being limited to a predetermined magnitude; first detection means for detecting a condition that the output voltage of the amplifier is smaller than a predetermined magnitude; second detection means for detecting a condition that the output stage of the amplifier is clipped; and protection characteristics varying means for varying limitation characteristics of the limiter means in accordance with detection results of the first and second detection means.

The foregoing objects and other objects as well as the characteristic features of the invention will become more apparent and more readily understandable by the following description and the appended claims when read in conjunction with the accompanying drawings.

DETAILED DESCRIPTION OF THE PREFERRED EMBODIMENT

Figure 1:
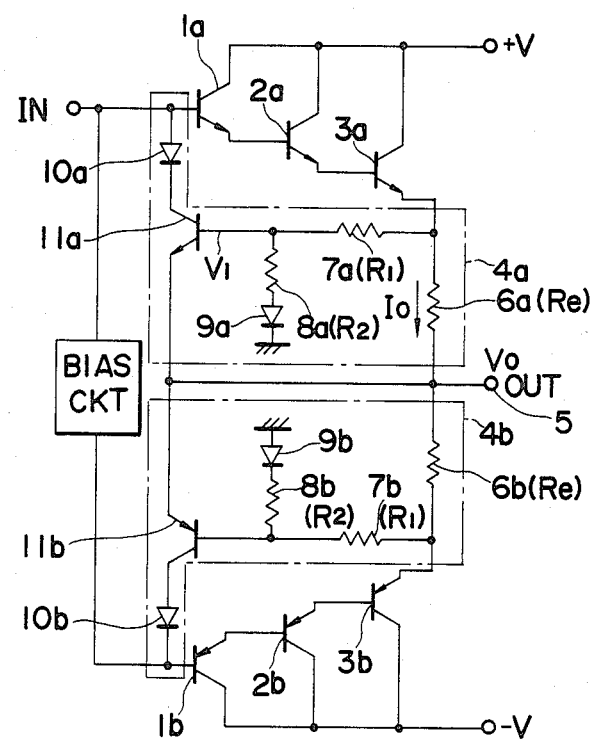
FIG. 1 is a schematic circuit diagram of a power amplifier having a prior art output transistor protection circuit with collector power dissipation limiter.
Figure 4:
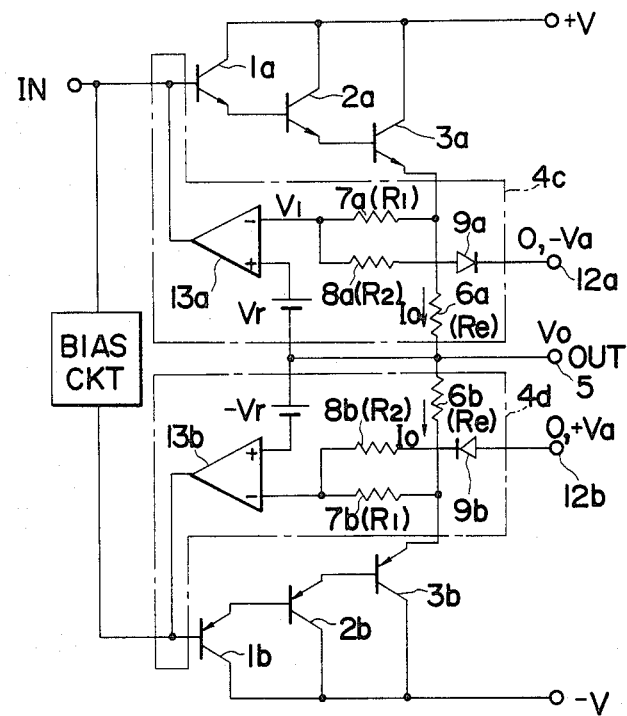
FIG. 4 is a schematic circuit diagram explaining a principle of operation of an output transistor protection circuit of the present invention.

Referring now to FIG. 4, there will be described a schematic circuit diagram of a power amplifier explaining a principle of operation of an output transistor protection circuit according to the invention. In the power amplifier shown in FIG. 4, a power amplifying section is same as that of the power amplifier shown in FIG. 1, and same parts as those shown in FIG. 1 are represented by same numerals and description of these parts is omitted. Reference numerals 4c and 4d designate output power protection circuits according to the present invention. The protection circuit 4c and 4d resemble the protection circuits 4a and 4b shown in FIG. 1, respectively, subject to differences of the following points. Namely, cathodes of diodes 9a and 9b are connected to terminals 12a and 12b, respectively. And, the diode 10a and the transistor 11a shown in FIG. 1 are replaced by a comparator 13a having an output terminal connected to a base of transistor 1a, an inverting input terminal being applied with a voltage V1 at a connection point of resistors 7a and 8a, and a non-inverting input teminal being applied with a sum voltage (Vo+Vr) of an output voltage Vo and a reference voltage Vr. While, in a negative side, the diode 10b and the transistor 11b shown in FIG. 1 are replaced by a comparator 13b in a same manner as a positive side.

Figure 2:
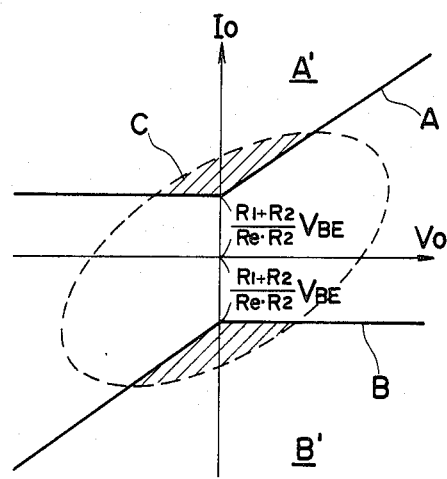
FIGS. 2 and 3 are graphs showing collector power dissipation characteristics of the protection circuits 4a and 4b shown in FIG. 1.
Figure 3:
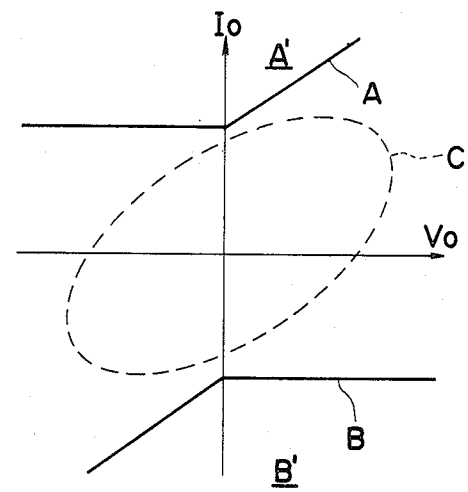

Now there will be described the principle of operation of the circuit constructed as aforesaid. Firstly, on the assumption that the terminals 12a and 12b are connected to the ground, the protection circuits 4c and 4d operate in same manner of output transistor dissipation limiting as the protection circuits 4a and 4b shown in FIG. 1. In detail, the inequality (2) and the equation (3), the $V_{BE}$ of which is substituted by the Vr, are established, and the collector power dissipation characteristics of the protection circuits 4c and 4d are expressed as solid lines A and B shown in FIG. 5 as similar as the characteristics of FIG. 2.

Secondly, on the assumption that the terminal 12a is connected to a certain voltage $-Va$, the voltage V1 which appears at the inverting input terminal of the comparator 13a is represented as follows:

$$V1 = (Re \cdot Io + Vo + Va) \times \frac{R2}{R1 + R2} - Va \qquad (4)$$

Hence, the condition where an output of the comparator 13a becomes low level is expressed by the following inequality (5).

$$(Re \cdot Io + Vo + Va) \times \frac{R2}{R1 + R2} - Va \leqq Vo + Vr \qquad (5)$$

Figure 6:
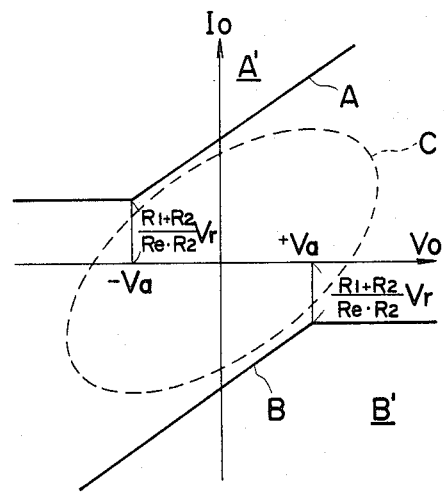

From the inequality (5) above, the collector power dissipation characteristics of the protection circuit 4a, with parameters of the output voltage Vo and the output current Io, are expressed as the following equations (6) and shown by the solid line A in FIG. 6.

$$Io = \frac{R1}{Re \cdot R2} \times (Vo + Va) + \frac{R1 + R2}{Re \cdot R2} \times Vr \qquad (6)$$

Figure 5:
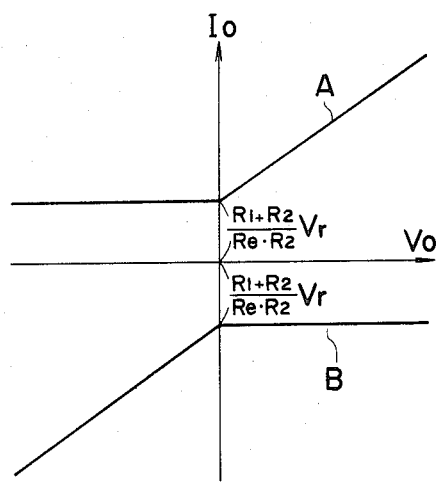
FIGS. 5 and 6 are graphs showing collector power dissipation characteristics of the protection circuits 4c and 4d shown in FIG. 4.

It can be noted here that the solid line A in FIG. 6 is one that the solid line A in FIG. 5 is shifted leftward. Specifically, as shown in FIG. 6 by the solid line A, a limitation level of the output current Io flowing through the transistor 3a becomes $(R1+R2)\times Vr/(Re\cdot R2)$ when the output voltage Vo becomes $-Va$, and when the output voltage Vo increases in a positive direction from the voltage $-Va$, the limitation level of the output current Io increases linearly by a gradient of $R1/(Re\cdot R2)$, and on the other hand when the output voltage Vo increases in a negative direction from the voltage $-Va$, the limitation level is maintained in a constant level of $(R1+R2)\times Vr/(Re\cdot R2)$ due to a non-conductiveness of the diode 9a. A limitation level of the output current Io flowing through the output transistor 3b is also presented by a solid line B in FIG. 6 on the assumption that the terminal 12b is connected to a certain voltage $+Va$. Accordingly, by means of adjusting the voltages $-Va$ and $+Va$ to appropriate values, it can be done that protection areas A' and B' go out of a area surrounded by the short dashes lines C presenting an operating area of a loudspeaker as shown in FIG. 6.

Considering the foregoing facts, the present invention is arranged so that in a normal condition of the amplifier, to the terminals 12a and 12b are applied the respective voltages $-Va$ and $+Va$ for developing the characteristics shown in FIG. 6 by the solid lines A and B, so that the limitation level $(R1+R2)\times (Re\cdot R2)$ of the output current Io at the condition Vo=0 (that is, the condition where the loudspeaker is continuously short-circuited) is set at small value for preventing the transistors 3a and 3b from the destructions, and so that in an abnormal condition, for example, where the loudspeaker is continuously short-circuited, the terminals 12a and 12b are connected to the ground for developing the characteristics shown in FIG. 5 by the solid lines A and B for preventing the transistors 3a and 3b from the destructions. And, a changeover of the voltages applied to the terminals 12a and 12b is performed utilizing a detection result of an output voltage level detection circuit which detects whether the output voltage of the amplifier becomes greater than a predetermined magnitude, and a detection result of a clipping condition detection circuit which detects whether the output current or the output voltage of the amplifier becomes clipped.

In the above-mentioned abnormal condition, for example where the loudspeaker is continuously short-circuited, the output voltage level is relatively small and the waveform of the output current or the output voltage is clipped, as shown in the following table.

TABLE

| Output | Output Voltage Level | |
| Stage | Great | Small |
| --- | --- | --- |
| Clipping Condition | Normal | Abnormal |
| Non-clipping Condition | Normal | Normal |

Therefore, the changeover of the voltage applied to the terminals 12a and 12b is performed so that the voltage $-Va$ and $+Va$ are applied to the respective terminals 12a and 12b only when the output voltage detection circuit detects the condition where the output voltage becomes smaller than the predetermined magnitude and the clipping condition detection circuit detects the clipping condition of the output stage.

Now referring to FIG. 7, there will be described a schematic circuit diagram of a power amplifier having the output transistor protection circuit of an embodiment of this invention, which utilizes the foregoing principle, and same parts as those shown in FIG. 4 are represented by same numerals and description of these parts is omitted. In this embodiment, a power amplifying section comprises an output stage amplifying part having Darlington connected NPN transistors 1a, 2a and 3a and Darlington connected PNP transistors 1b, 2b and 3b, a driving stage amplifying part 14, biasing voltage sources 15a and 15b connected between an output terminal of the driving stage amplifying part 14 and respective bases of the transistors 1a and 1b, a negative feedback circuit for negative feeding an output voltage Vo of the amplifier back to an inverting input terminal of the driving stage amplifying part 14. And, in protection circuits 4c and 4d, transistors 16a and 16b for driving respective transistors 11a and 11b are added.

An output voltage detection circuit 17 is arranged so as to output high binary level "1" when the output voltage becomes greater than a predetermined magnitude, and so as to output low binary level "0" when the output voltage becomes smaller than the predetermined magnitude. A clipping condition detection circuit 18 detects the clipping condition of the output current or the output voltage of the amplifier by detecting a value of a current flowing from a power source to the driving stage amplifying part 14. More specifically, the clipping condition of the output stage is detected as follows.

In a condition where an input signal increases when the output voltage of the amplifier reaches to a power supply voltage $+V$ or $-V$ so as to be clipped in its waveform, a negative feedback signal is normally suppressed into a constant magnitude. In this condition, therefore, it represents a clipping condition of the output stage so that the current value in the driving stage amplifying part 14 becomes extremely greater than that in a normal amplifying state. In addition to this, in a condition where the input signal is small, the current value in the driving stage amplifying part 14 is normally small. In this condition, however, when the load of the amplifier is short-circuited or when an impedance of the load becomes extremely small, output current of the output stage increases to the extent that the input current of the output stage is limited to a certain magnitude resulting from the bypassing function of the output current of the driving stage amplifying part 14 by the protection circuit 4c or 4d, with the result that the output current of the driving stage amplifying part 14 becomes extremely great. Therefore, it also represents another clipping condition of the output stage that the current value in the driving stage amplifying part 14 becomes extremely greater than that in a normal amplifying state.

Accordingly, the clipping condition detection circuit 18 can detect two clipping conditions of the output stage as above-stated based on the detection of the current value in the driving stage amplifying part 14.

For the detection of the current value in the driving stage amplifying part 14, the clipping detection circuit 18 is arranged so as to output high binary level "1" when the current value in the driving stage amplifying part 14 becomes greater than a predetermined magnitude, and so as to output low binary level "0" when the current value becomes smaller than the predetermined magnitude. An abnormal condition detection circuit 19 is arranged so as to connect terminals 12a and 12b to the ground when the output of the detection circuit 17 is low ("0") and the output of the detection circuit 18 is high ("1"), and so as to supply terminals 12a and 12b with respective voltages −Va and +Va in other condition than the above condition.

Now there will be described the operation of the circuit constructed as aforesaid. Under the abnormal condition where a loudspeaker as a load of the amplifier is short-circuited or where an impedance of the load is reduced extremely to a small magnitude, the output voltage Vo becomes small to make the output of the detection circuit 17 of "0", and the current value in the driving stage amplifying part 14 becomes great to make the output of the detection circuit 18 of "1". Accordingly, the abnormal condition detection circuit 19 makes the terminals 12a and 12b connected to the ground, with the result that the output power dissipation characteristics of the protection circuits 4c and 4d are set as the one shown in FIG. 5 by the solid lines A and B, thereby the limitation level of the output current Io being set small as $(R1+R2) \times V_{BE}/(Re \cdot R2)$. Hence, the protection of the output transistors are surely achieved.

On the other hand, under the normal condition, the abnormal condition detection circuit 19 makes the terminals 12a and 12b connected to the respective voltages −Va and +Va, with the result that the output power dissipation characteristics of the protection circuits 4c and 4d are set as the one shown in FIG. 6 by the solid lines A and B, thereby no waveform destruction of the output being developed.

Figure 7:
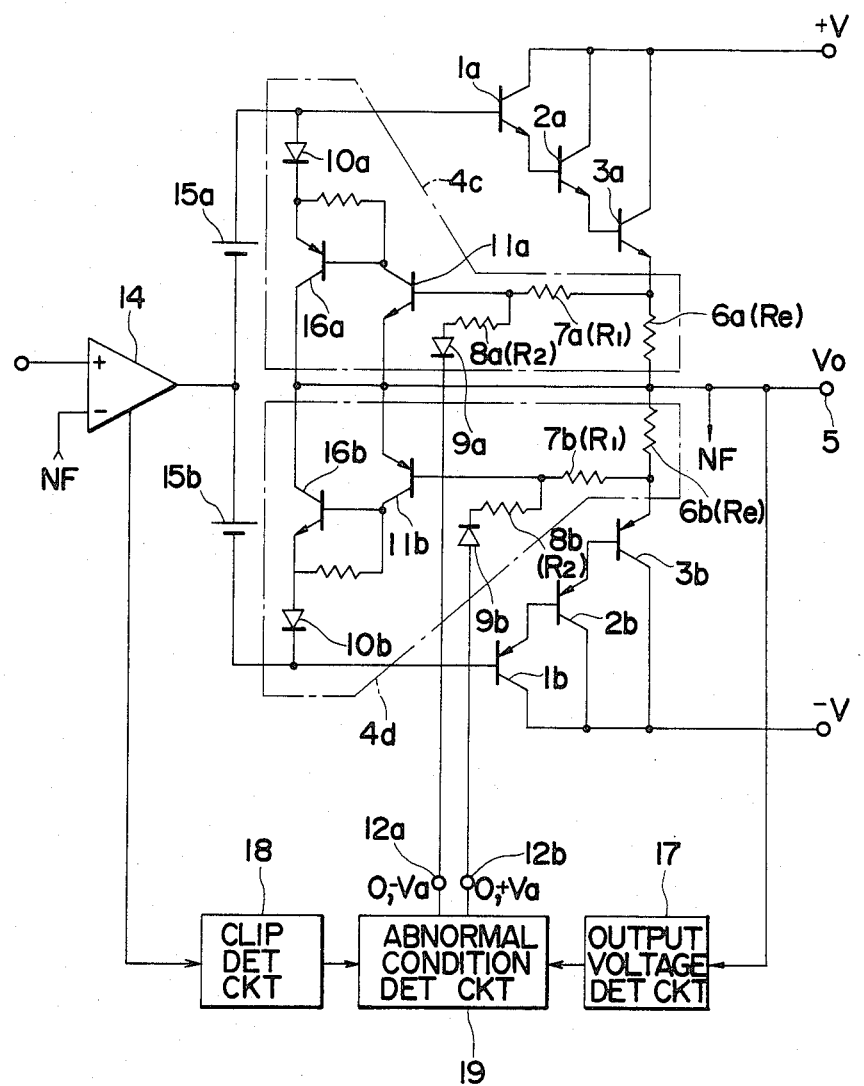
FIG. 7 is a schematic circuit diagram of a power amplifier having an output transistor protection circuit with collector power dissipation limiter of an embodiment according to the present invention.
Figure 8:
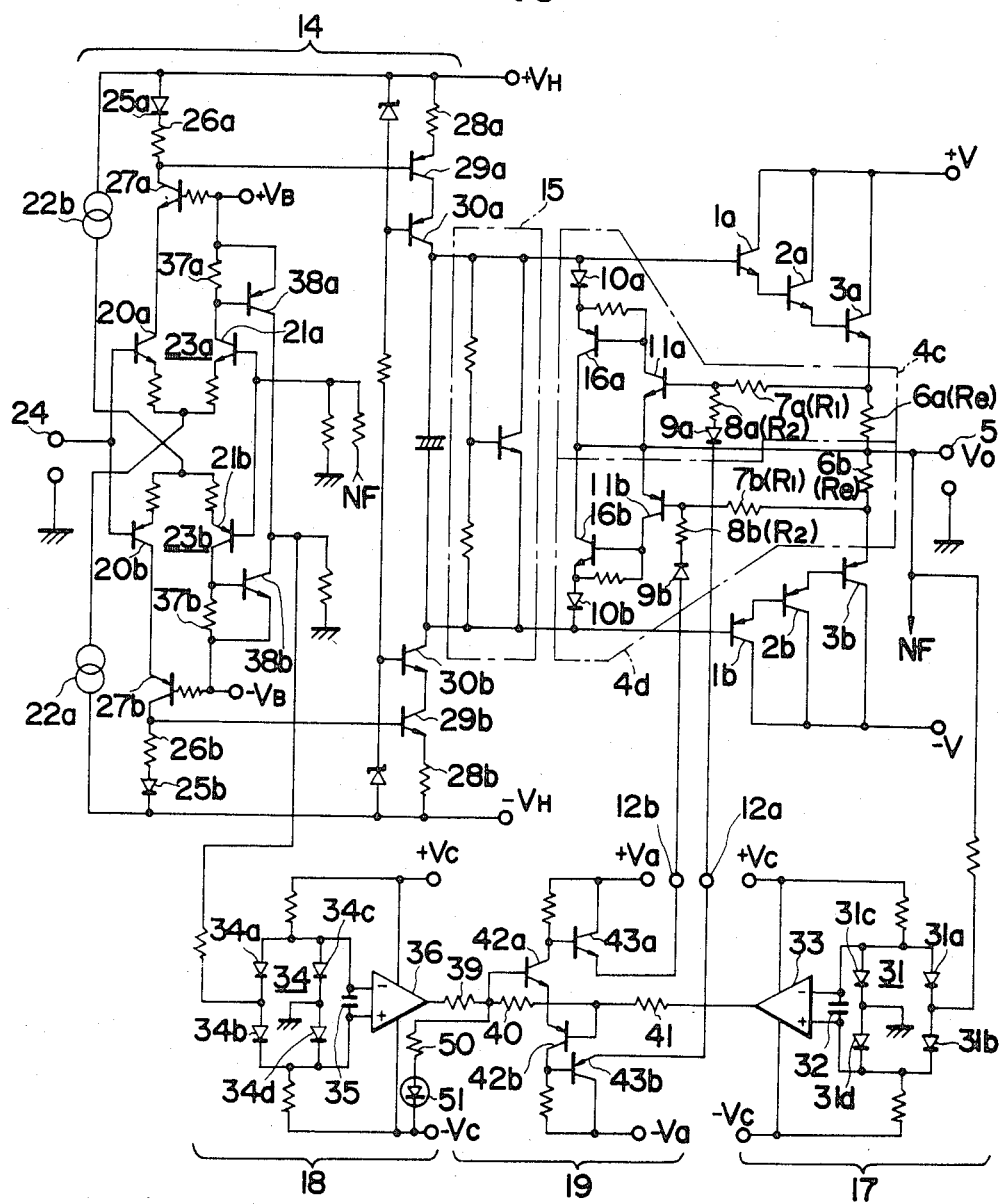
FIG. 8 is a detail schematic circuit diagram of a power amplifier shown in FIG. 7.

FIG. 8 shows a detail schematic circuit diagram of a power amplifier shown in FIG. 7, and same parts as those shown in FIG. 7 are represented by same numerals and description of these parts is omitted. In this circuit, a driving stage amplifying part 14 comprises a differential amplifier 23a having NPN transistors 20a and 21a and a constant current source 22a, and a differential amplifier 23b having PNP transistors 20b and 21b and a constant current source 22b, the differential amplifiers 23a and 23b being in complementary configuration, and amplifying an input signal applied to an input terminal 24. A diode 25a, a resistor 26a and an NPN transistor 27a cathcode-connected to the transistor 20a operate as a load of the transistor 20a, a diode 25a, resistors 26a and 28a and a PNP transistor 29a operate as a current mirror circuit, and a PNP transistor 30a is cathcode-connected to a collector of the transistor 29a. An output of the differential amplifier 23a is derived from the collector of the transistor 30a.

A negative side of the driving stage amplifying part 14 is constructed in same manner as the above-said positive side with a complementary configuration, and an output of the differential amplifier 23a is derived from a collector of the transistor 30b. The outputs derived from the collectors are applied to bases of respective transistors 1a and 1b, and between the bases of the transistors 1a and 1b are connected a bias circuit 15.

An output voltage detection circuit 17 comprises a diode bridge circuit 31 having diodes 31a through 31d, a capacitor 32 and a comparator 33, and when the output voltage Vo is in a low voltage level, the capacitor 32 is charged by a forward voltage drop of the diodes 31c and 31d of about 1.2 [Volts] due to too little conductiveness of the diode 31a or 31b, with the result that an output of the comparator 33 is set at the low level (about −Vc: negative power supply voltage). On the other hand, when the output voltage Vo is in a high voltage level, the capacitor 32 is charged in an opposite polarlity to the charging polarity of the above case due to the conductiveness of the diode 31a or 31b, and the output of the comparator 33 is set at the high level (about +Vc: positive power supply voltage) when a voltage across the capacitor 33 becomes greater than 0 [Volt].

A clipping condition detection circuit 18 is comprised of a diode bridge circuit 34 having diodes 34a through 34d, a capacitor 35, a comparator 36, and resistors 37a and 37b and transistors 38a and 38b in the driving stage amplifying part 14. In the circuit 18, when the output current and the output voltage of the amplifier are both in a small level, collector current of the transistors 21a or 21b, or the current flowing from the power supply into the differential amplifier 23a or 23b is small because of a small voltage difference between the bases of the transistors 21a and 21b due to the normal negative feedback function, and hence the transistors 38a and 38b are non-conductive. Accordingly, the capacitor 35 is charged by a forward voltage drop of the diodes 34c and 34d of about 1.2 [Volts] due to non-conductiveness of the diodes 34a and 34b, with the result that an output of the comparator 36 is set at the low level (about −Vc: negative power supply voltage). On the other hand, on the condition when the output voltage of the amplifier reaches to a power supply voltage +V or −V so as to be clipped in its waveform, or when the output current Io increases so as to be clipped in its waveform by limiting function of the protection circuit 4c or 4d, a collector current of the transistor 21a or 21b easily becomes to be the current level of the constant current source 22a or 22b as the input signal increases, although the increase of the output voltage is suppressed to a certain magnitude thereby the negative feedback signal being limited to a certain constant magnitude. Accordingly, the collector current of the transistor 21a or 21b make the transistors 38a or 38b conductive. Therefore, the diode 34a or 34b becomes conductive, and the capacitor 35 is charged in an opposite polarity to the charging polarity of the above case, with the result that the output of the comparator 36 becomes the high level (about +Vc: positive power supply voltage). Reference numerals 50 and 51 designate resistor and light emission diode, respectively, and these parts function to indicate the clipping condition of the output stage of the amplifier by an emission of the diode 51.

An abnormal condition detection circuit 19 is comprised of series-connected resistors 39, 40 and 41 between the outputs of the comparator 36 and 33 having same resistance values each other, NPN transistors 42a and 43a, and PNP transistors 42b and 43b. Conductions of the transistors 42a and 42b are controlled based on a voltage across the resistor 40, and conductions of the transistors 43a and 43b are controlled by the transistors 42a and 42b. In the detection circuit 19, the terminals 12a and 12b are connected to the ground potential due to the conductiveness of the transistors 42a and 42b only when the outputs of the comparators 33 and 36 are in a low level and in a high level, respectively. Except the above condition, the transistors 42a and 42b are non-conductive, and the transistors 43a and 43b are conductive, so that the terminals 12a and 12b are applied with respective voltages −Va and +Va.

It should be noted here that charging times of the capacitors 32 and 35 are set at about 0.5 [sec], so that the detection circuits 17 and 18 do not output the high level signals due to insufficient charges in the capacitors 32 and 35 even if there will be momentarily developed the condition where the output voltage Vo is in a low level and the output stage is clipped.

What is claimed is:

1. An output transistor protection circuit in a power amplifier with collector power dissipation limitation comprising:

limiter means for limiting an input signal of the amplifier in accordance with an output voltage level of the amplifier and a current level of the output transistor, whereby power dissipation at a collector-emitter junction of the output transistor is limited to a predetermined magnitude;

first detection means for detecting a condition that the output voltage of the amplifier is smaller than a predetermined magnitude;

second detection means for detecting a condition that the output stage of the amplifier is clipped;

abnormal condition detection means for producing an abnormal condition detection signal based on detection of outputs from said first detection means at the time when the output voltage of the amplifier is smaller than said predetermined magnitude and from said second detection means at the time when the output stage of the amplifier is clipped; and protection characteristics varying means for varying limitation characteristics of said limiter means in accordance with said abnormal condition detection signal from said abnormal condition detection means, wherein when said abnormal condition detection means detects the abnormal condition of the amplifier, said protection characteristics varying means varies the limitation characteristics of said limiter means so that said limiter means limits the input signal of the amplifier at a smaller current value of the output transistor than a current value of the output transistor under a normal condition of the amplifier.

2. An output transistor protection circuit according to claim 1, wherein:

said limiter means comprises a comparator having one input terminal applied with a voltage responsive to the output voltage of the amplifier, the other input terminal applied with a voltage responsive to a level of the output current of the amplifier, and an output terminal coupled to an input of the output transistor;

said input of the output transistor being bypassed to the ground in accordance with the voltages applied to the input terminals of said comparator.

3. An output transistor protection circuit according to claim 2, wherein:

said limiter means comprises a bypass circuit for bypassing the input of the output transistor to the ground, which is comprised of a variable resistance element which resistance value is varied in accordance with the voltages applied to the input terminals of said comparator.

4. An output transistor protection circuit according to claim 3, wherein:

said comparator of said limiter means voltage-shifts a potential of the voltage applied to the other terminal of said comparator in response to said abnormal condition detection signal, so that a sensitivity of said comparator is varied.

5. An output transistor protection circuit according to claim 4, wherein:

each of said first and second detection means comprises a time constant circuit and outputs its detection output at the time when a condition to be detected is continued for a period of time determined by a time constant of said time constant circuit.

6. An output transistor protection circuit according to claim 1, wherein:

said second detection means comprises a detection circuit which detects a clipping condition of said output stage by detecting an operating condition of driving amplifying means for driving said output stage.

7. An output transistor protection circuit according to claim 6, wherein:

said driving amplifying means is comprised of a differential amplifier having one output for driving said output stage of the amplifier and the other output for operating a function of said detection circuit of the second detection means.

* * * * *